United States Patent
Lee et al.

(10) Patent No.: US 9,333,619 B2
(45) Date of Patent: May 10, 2016

(54) ADAPTIVE ENDPOINT METHOD FOR PAD LIFE EFFECT ON CHEMICAL MECHANICAL POLISHING

(71) Applicants: Chu-An Lee, Hsinchu (TW); Hui-Chi Huang, Taipei (TW); Peng-Chung Jangjian, Hsinchu (TW)

(72) Inventors: Chu-An Lee, Hsinchu (TW); Hui-Chi Huang, Taipei (TW); Peng-Chung Jangjian, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 431 days.

(21) Appl. No.: 13/758,658

(22) Filed: Feb. 4, 2013

(65) Prior Publication Data

US 2013/0146224 A1    Jun. 13, 2013

Related U.S. Application Data

(62) Division of application No. 13/045,289, filed on Mar. 10, 2011, now Pat. No. 8,367,429.

(51) Int. Cl.
| | |
|---|---|
| *H01L 21/465* | (2006.01) |
| *B24B 37/20* | (2012.01) |
| *B24B 37/013* | (2012.01) |
| *B24B 49/12* | (2006.01) |
| *H01J 37/32* | (2006.01) |
| *H01L 21/66* | (2006.01) |
| *H01L 21/321* | (2006.01) |

(52) U.S. Cl.
CPC ............... *B24B 37/20* (2013.01); *B24B 37/013* (2013.01); *B24B 37/205* (2013.01); *B24B 49/12* (2013.01); *G05B 2219/49085* (2013.01); *H01J 37/32963* (2013.01); *H01L 21/3212* (2013.01); *H01L 22/26* (2013.01); *H01L 2924/0002* (2013.01)

(58) Field of Classification Search
USPC ............. 156/345.13, 345.12, 345.15, 345.16, 156/345.24, 345.25, 345.26
See application file for complete search history.

(56) References Cited

U.S. PATENT DOCUMENTS

| | | | | |
|---|---|---|---|---|
| 5,876,265 | A | * | 3/1999 | Kojima ................. B24B 37/013 438/691 |
| 6,238,273 | B1 | | 5/2001 | Southwick |
| 6,458,014 | B1 | | 10/2002 | Ihsikawa et al. |
| 6,876,454 | B1 | | 4/2005 | Birang et al. |
| 6,896,588 | B2 | | 5/2005 | Lanier et al. |
| 7,520,797 | B2 | | 4/2009 | Bottema et al. |
| 7,938,714 | B2 | | 5/2011 | Benvegnu et al. |
| 8,039,397 | B2 | | 10/2011 | David et al. |
| 8,118,641 | B2 | | 2/2012 | Kulp et al. |
| 2002/0173231 | A1 | * | 11/2002 | Hasegawa ......................... 451/6 |
| 2002/0182986 | A1 | * | 12/2002 | Tung et al. ...................... 451/56 |
| 2002/0197934 | A1 | * | 12/2002 | Paik ....................... B24B 37/013 451/21 |

(Continued)

FOREIGN PATENT DOCUMENTS

WO    WO98/55264    * 12/1998    ............ B24B 37/013

*Primary Examiner* — Sylvia R Macarthur
(74) *Attorney, Agent, or Firm* — Haynes and Boone, LLP

(57) ABSTRACT

The present disclosure provides a chemical mechanical polishing (CMP) system. The CMP system includes a pad designed for wafer polishing, a motor driver coupled with the pad and designed to drive the pad during the wafer polishing, and a controller coupled with the motor driver and designed to control the motor driver. The CMP system further includes an in-situ rate monitor designed to collect polishing data from a wafer on the pad, determine CMP endpoint based on a life stage of the pad, and provide the CMP endpoint to the controller.

20 Claims, 9 Drawing Sheets

(56) References Cited

U.S. PATENT DOCUMENTS

| | | |
|---|---|---|
| 2005/0075055 A1* | 4/2005 | Lanier et al. ............ 451/56 |
| 2005/0118839 A1* | 6/2005 | Chen .................... 438/795 |
| 2006/0063383 A1 | 3/2006 | Pattengale, Jr. |
| 2006/0141907 A1* | 6/2006 | Rudolph et al. ........... 451/6 |
| 2006/0252352 A1* | 11/2006 | Jeng et al. ................ 451/8 |
| 2008/0242195 A1* | 10/2008 | Heinrich ........... B24B 37/013 451/6 |
| 2008/0242196 A1 | 10/2008 | Marxsen et al. |
| 2009/0036024 A1* | 2/2009 | Matsuzaki ................ 451/5 |
| 2009/0137190 A1 | 5/2009 | Togawa et al. |
| 2010/0099334 A1* | 4/2010 | Bennett ............ B24B 37/013 451/5 |
| 2013/0146224 A1* | 6/2013 | Lee et al. ............. 156/345.13 |

* cited by examiner

ADAPTIVE ENDPOINT METHOD FOR PAD LIFE EFFECT ON CHEMICAL MECHANICAL POLISHING

CROSS-REFERENCE

This application is a divisional of U.S. patent application Ser. No. 13/045,289, filed on Mar. 10, 2011, which is hereby incorporated by reference in its entirety.

BACKGROUND

In semiconductor manufacturing, chemical mechanical polishing (CMP) is a process designed to polish a substrate and to provide a global planarized surface. The CMP process can be implemented at various integrated circuit (IC) fabrication stages, such as a shallow trench isolation (STI) process and a dual damascene process. A CMP process should be stopped at a proper time (referred to as endpoint) such that there is no over polishing or under polishing. During a CMP process, a pad is used and will gradually wear out. CMP behavior will change along with the pad's condition. Existing CMP systems do not consider the pad condition and can not precisely determine the endpoint accounting for the pad condition. For example, a CMP system Mirra developed by Applied Materials uses a fixed algorithm to determine the endpoint regardless the pad condition. Thus, over polishing, under polishing, or unacceptable dishing or erosion may arise during the CMP process, introducing shorting, opening, or performance or reliability issues. Therefore, to address the above issues, there is a need for a CMP system and method that precisely determines the CMP endpoint by considering the pad condition.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

DETAILED DESCRIPTION

Figure 1:
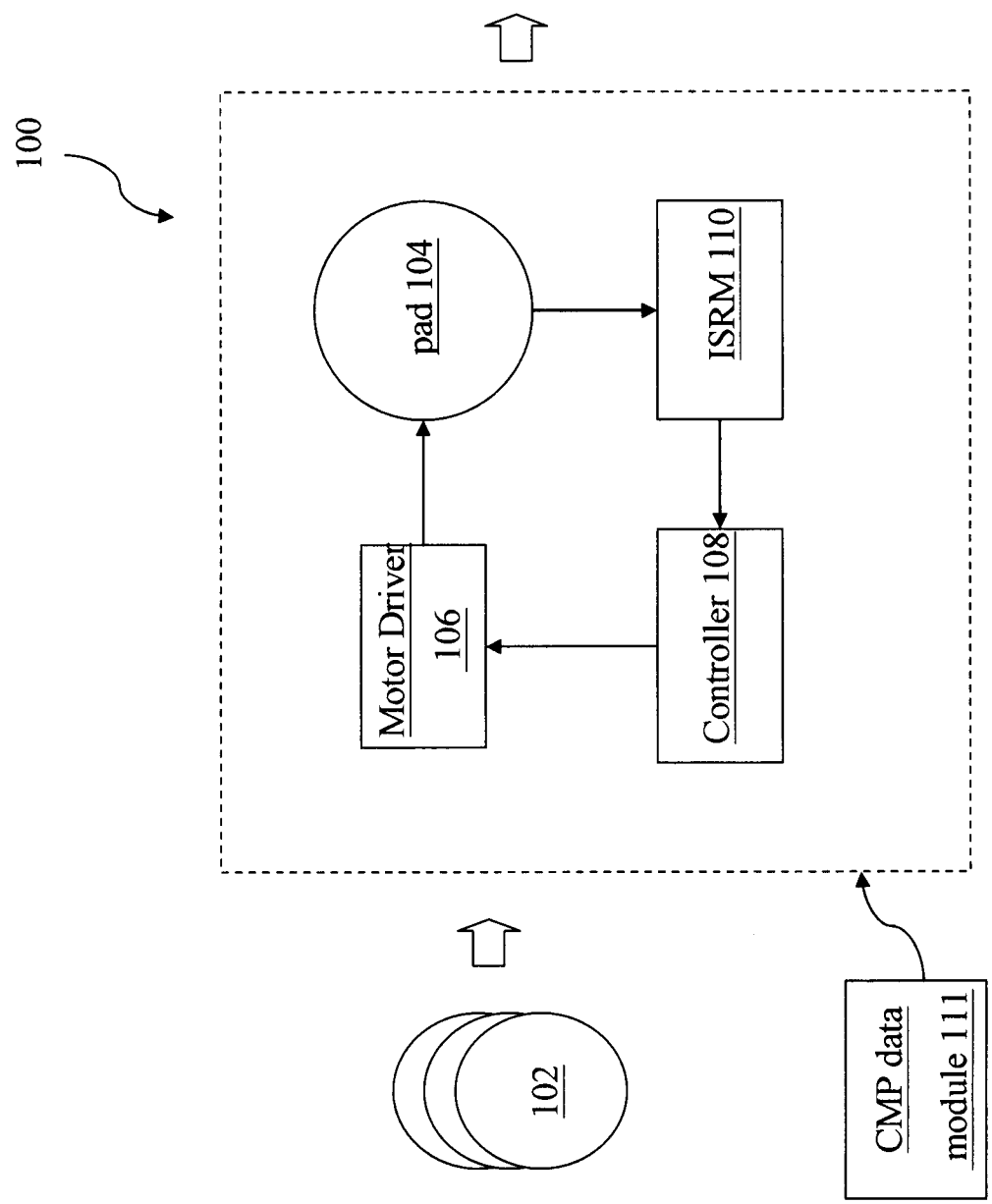
FIG. 1 is a schematic view of one embodiment of a chemical mechanical polishing (CMP) system constructed according to various aspects of the present disclosure.

The present disclosure relates generally to a chemical mechanical polishing (CMP) system and a method of utilizing such system. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a schematic view of one embodiment of a chemical mechanical polishing (CMP) system 100. The CMP system 100 includes one or more polishing pads 104 configured in the CMP system for polishing wafers 102. For simplicity, only one polishing pad is illustrated in FIG. 1.

The CMP system 100 includes a motor driver 106 coupled with the polishing pad 104 and designed to drive the polishing pad 104 during a CMP process (or polishing process). The CMP system 100 also includes a controller 108 coupled with the motor driver 106 and designed to control the motor driver 106 during the CMP process.

The CMP system 100 further includes an in-situ rate monitor (ISRM) 110 designed to in-situ monitor the polishing rate from the CMP process, such as from the polishing pad 104 or a wafer on the polishing pad 104 during the CMP process. The ISRM 110 is designed to in-situ collect CMP data, including the polishing rate, from the polishing pad 104 or from the wafer positioned on the polishing pad 104 during the CMP process. In one embodiment, the ISRM 110 may further include a signal module designed to extract a polishing signal (or endpoint signal) from the wafer; a mechanism for applying a ladder coefficient to amplify the polishing signal according to a life stage of the polishing pad 104; a window module for defining and applying multiple endpoint windows with respective window widths; and an endpoint module for determining the CMP endpoint by applying one of the multiple endpoint windows to the polishing signal according to the life stage of the polishing pad. A life stage of the polishing pad is also referred to as a time region of the life time of the polishing pad and will be further described below.

The CMP system 100 may further include other components, such as polishing head(s), a mechanism to supply polishing slurry, a water supply, a wafer loading mechanism, and other necessary components. In one example, various analysis and processes of the CMP data may be implemented by a CMP data module 111 incorporated in or integrated with the CMP system 100. In another example, the CMP data module 111 may be a component of the ISRM 110 designed for CMP data analysis.

The CMP system 100 is designed to polish the wafers 102 for reduced thicknesses and planarized surfaces. In various embodiments, the plurality of wafers 102 may be processed sequentially or simultaneously by the CMP system 100, depending on configuration of the CMP system 100. As one example, the CMP system 100 includes a Mirra Electra CMP apparatus developed by Applied Materials. The Mirra Electra CMP apparatus includes multiple pads for multi-step polishing. In the Mirra Electra CMP apparatus, the ISRM 110 monitors the polishing signal through eddy current.

Figure 2:
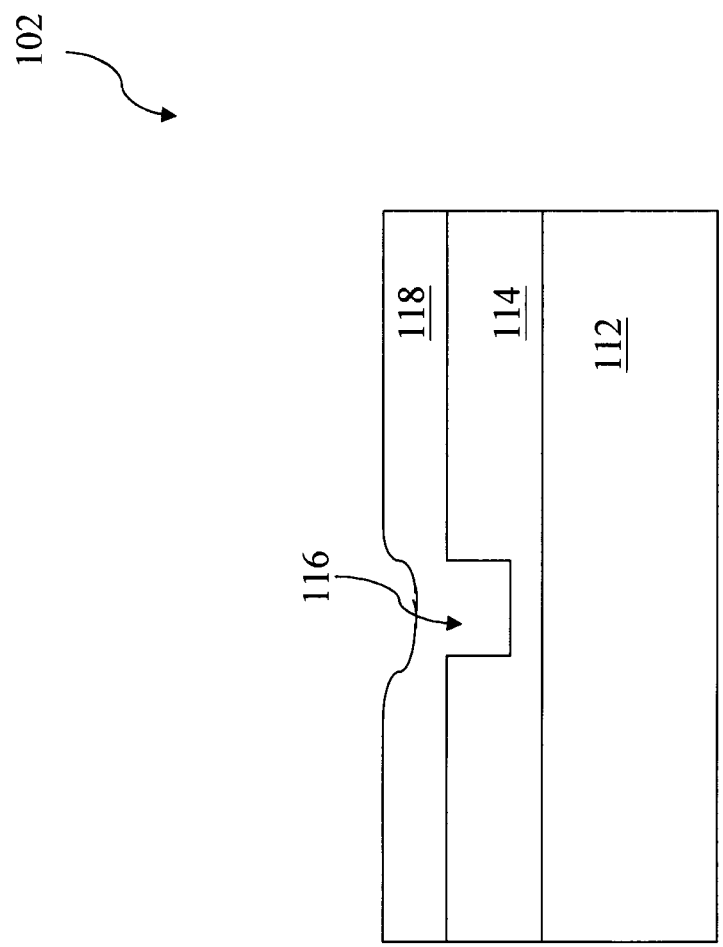
FIG. 2 is a sectional view of a semiconductor wafer processed in the CMP system of FIG. 1.

The wafers 102 include silicon wafers. Alternatively, the wafers 102 can be silicon germanium wafers or other semiconductor wafers. The wafers 102 may include various features of the designed integrated circuit. For example, the wafers 102 may include various doped features in silicon and may additionally include others features, such as gate electrodes and/or metal lines. In the present example, for illustration only, FIG. 2 illustrates one of the wafers 102 in a sectional view. The wafer 102 includes a silicon substrate 112 and a dielectric material layer 114 disposed on the silicon substrate 112. In one example, the dielectric material layer 114 includes silicon oxide. In other examples, the dielectric material layer 114 may additionally or alternatively include silicon nitride, silicon oxynitride, or other suitable dielectric material. A trench 116 is formed in the dielectric material layer 114. A metal layer 118, such as aluminum (Al), is filled in the trench 116 and further formed on the dielectric material layer 114. The metal layer 118 has a non-flat surface, and therefore a CMP process is applied to the wafer 102 to planarize the wafer 102 and remove the portion of the metal layer 118 above the top surface of the dielectric material layer 114. As one example, the metal layer 118 in the trench 116 forms a metal gate during a gate-last process.

After one or more of the wafers 102 are moved into the CMP system 100, the intended CMP process is applied to the wafers 102 according to the corresponding polishing recipe. However, the CMP endpoint is a critical factor to the polishing result. The CMP endpoint (or endpoint) is defined as a time when the CMP process is ended. Over polishing or under polishing may lead to oxide loss, unacceptable dishing, erosion, or metal residue, and may further introduce shorting, opening, or other performance and reliability issues. A CMP method is provided below to address those issues.

Figure 3:
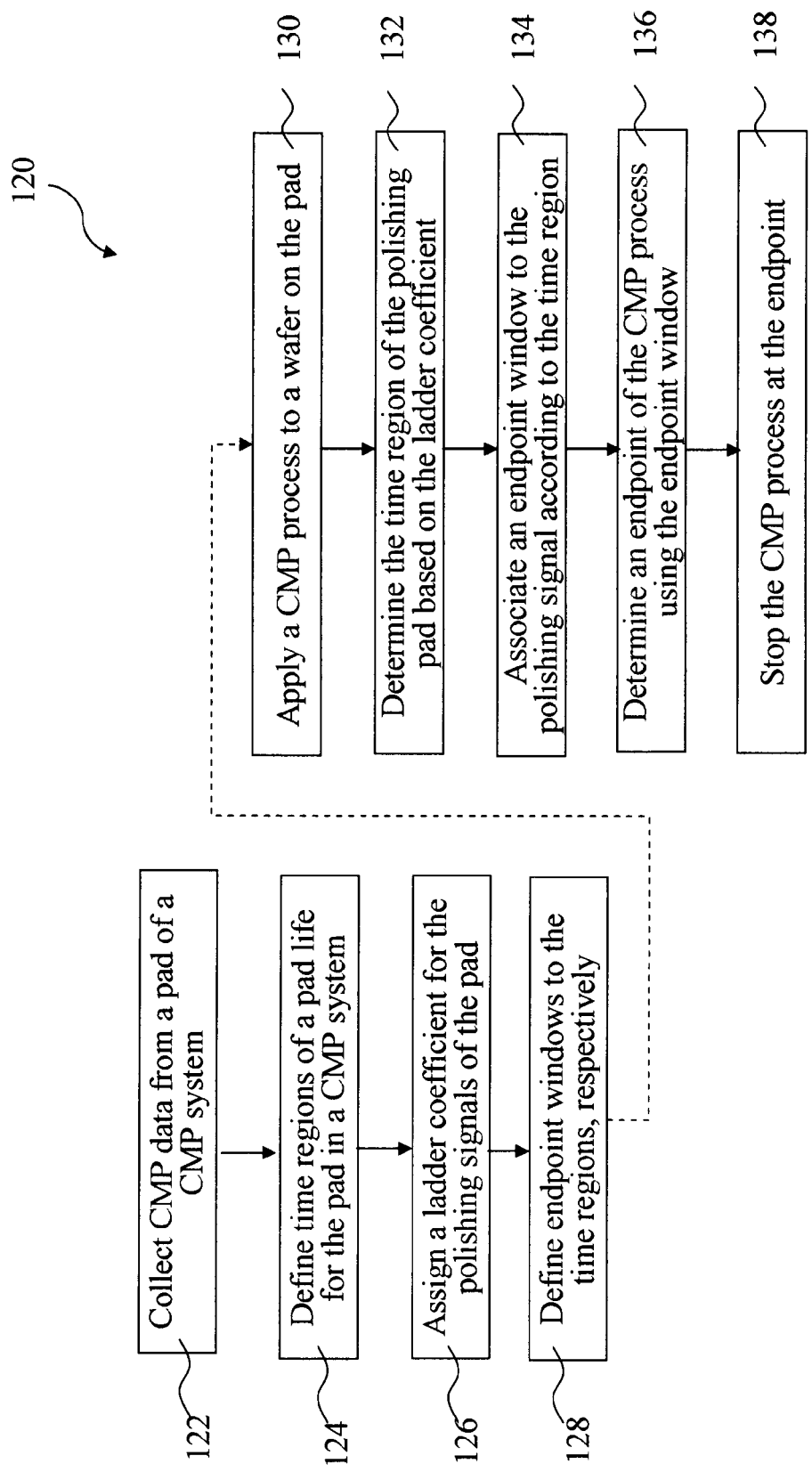
FIG. 3 is a flowchart of a CMP process implemented in the CMP system of FIG. 1 constructed according to various aspects of one embodiment of the present disclosure.

FIG. 3 is a flowchart of a method 120 for performing a CMP process constructed according to various aspects of the present disclosure. In the present embodiment, the method 120 is implemented in the CMP system 100. With reference to FIGS. 1 through 3, the method 120 is described in detail. The method 120 begins at step 122 by collecting CMP data associated with the polishing pad 104 of the CMP system 100. In one example, collecting the CMP data is performed by the CMP data module 111. The CMP data include various existing CMP processing data associated with the polishing pad 104, such as CMP system history data, metrology tool data, and statistical process control (SPC) data. In various examples, the CMP system history data includes polishing rate, CMP failure information, system maintenance record data, and/or polishing pad replacement record data. The SPC data includes polishing rate and out of specification (OOS) records.

The method 120 proceeds to step 124 by defining time regions of a pad life for the polishing pad 104 of the CMP system 100. The polishing pad 104 has a certain life time (or pad life) and should be replaced by a new polishing pad before or at the end of the life time. For example, a polishing pad may reach its life time after performing CMP processes to about 400 wafers. In another example, a polishing pad may reach its life time after performing CMP processes to about 200 wafers.

During the life time of the polishing pad, the polishing behavior of the polishing pad 104 changes over the time the polishing pad is used (use time), which is referred to as pad life effect. For example, the polishing pad's polish rate may change through its life time. In another example, the polishing pad's polish ratio may change through its life time. In the depicted embodiment, the polish ratio is defined as a ratio between the polish rate of the metal layer 118 and the polish rate of the dielectric material layer 114. In another example where silicon oxide is used as the dielectric material layer 114, the polishing rate of silicon oxide (or oxide loss) changes through the life time of the polishing pad. Existing CMP systems, such as the Mirra Electra CMP apparatus, the CMP endpoint is determined by one endpoint window without considering the pad life effect.

Figure 4:
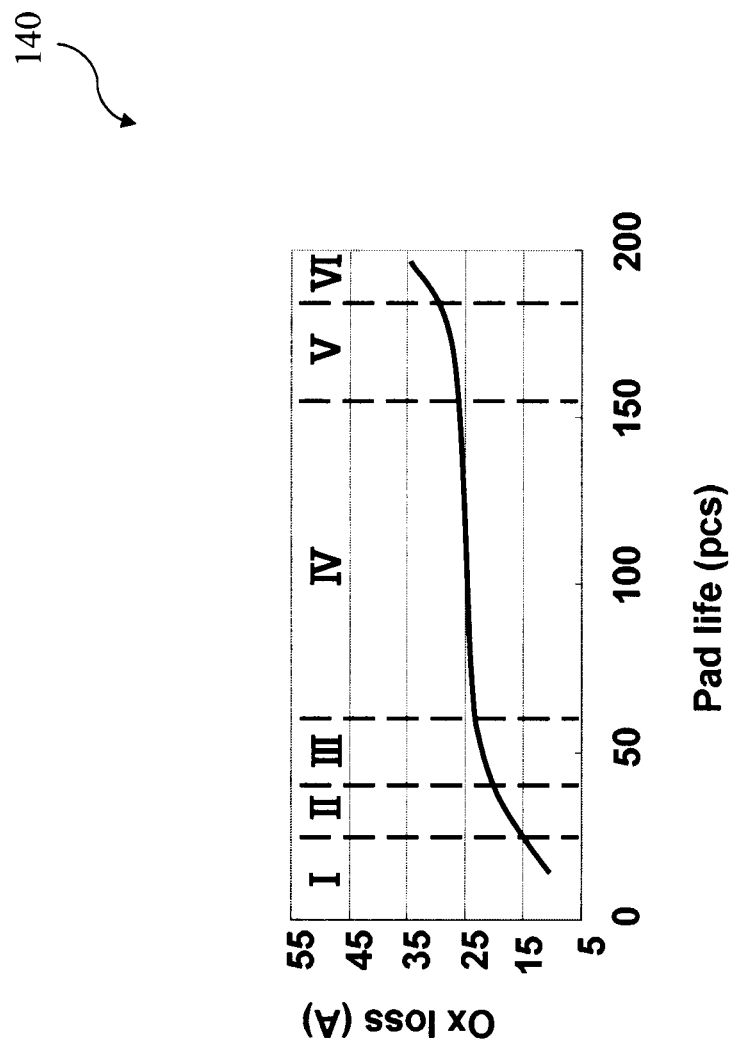
FIG. 4 is a chart of a CMP polishing signal over the polishing time.

In step 124 of the method 120, based on the CMP data associated with the polishing pad 104, the polishing behavior of the polishing pad 104 can be characterized as a function of its use time. FIG. 4 includes a chart 140 illustrating the oxide loss over the use time of the polishing pad according to one example. In chart 140, the horizontal axis represents the use time of the polishing pad, labeled as "pad life." The use time of the polishing pad has an unit as pieces ("pcs") that stands for pieces of wafers having been polished by the polishing pad 104. In the current example, the life time of the polishing pad 104 is about 200 pieces of wafers. The vertical axis represents the oxide loss with the unit as angstrom ("Å"). As shown in the chart 140, the oxide loss changes over the use time of the polishing pad. In the present embodiment, the oxide loss is used to define life stages (or time regions of the life time) for the polishing pad 104. As one example, the life time of the polishing pad is divided into six time regions, labeled as "I", "II", "III", "IV", "V", and "VI", respectively, according to the behavior of the oxide loss. After the last time region ("VI" in this example), the oxide loss is too large and significantly affects the yield. The polishing pad has to be replaced with a new polishing pad. In another example, the pad life may include three time regions, four time regions, or more time regions depending on the oxide loss characteristics. In other embodiments, the time regions of the pad life may be determined by other CMP parameter(s), such as polishing rate or polishing ratio.

Figure 5:
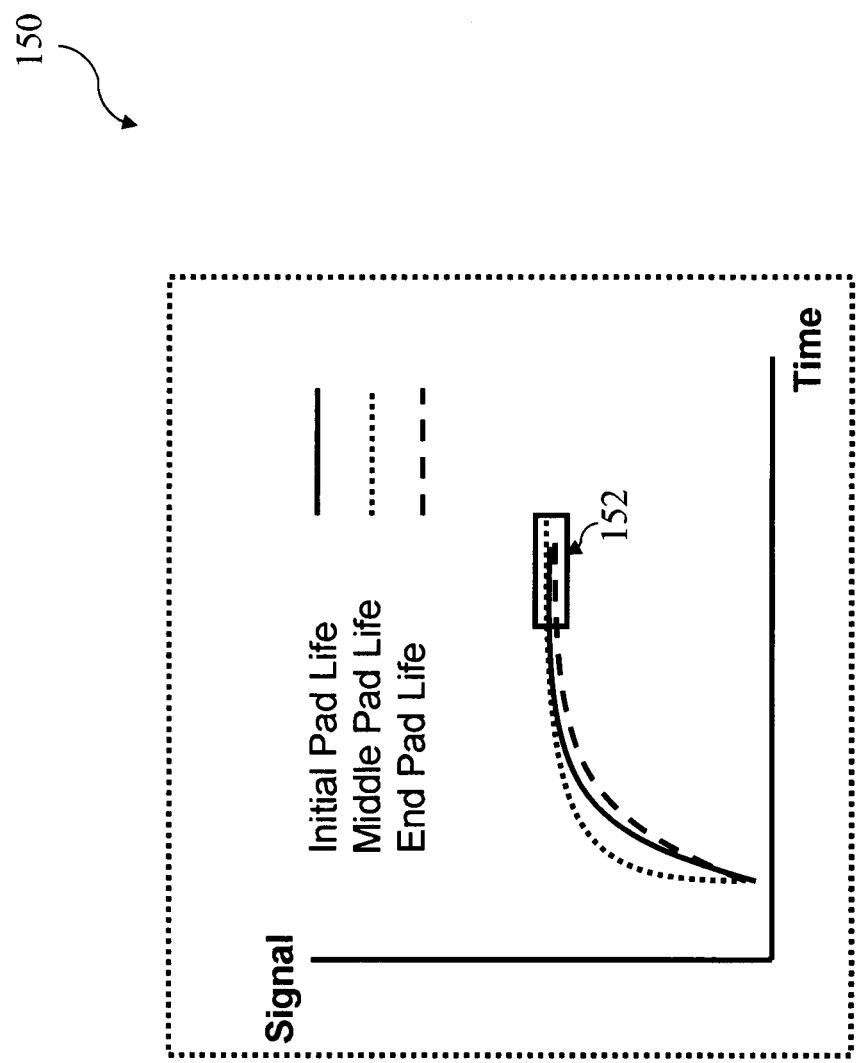
FIG. 5 is a chart of polishing signals at various time regions constructed according to various aspects of the present disclosure.

The method 120 proceeds to step 126 by assigning a ladder coefficient for the polishing signal of the polishing pad 104. During a CMP process, a polishing signal can be collected by the ISRM 110. In one example, the polishing signal is converted from the eddy current and can be further amplified with a certain signal gain. FIG. 5 illustrates various polishing signals from different time regions of the pad life. In FIG. 5, the horizontal axis is polishing time (labeled as "time") and the vertical axis is the polishing signal (labeled as "signal"). The three polishing signals correspond to the three time regions of the pad life (labeled as initial pad life, middle pad life, and end pad life), respectively. The endpoint window will be further explained in the following steps of the method. In the existing method, only one endpoint window is used to determine the CMP process's endpoint without considering the respective time region of the pad life.

Figure 6:
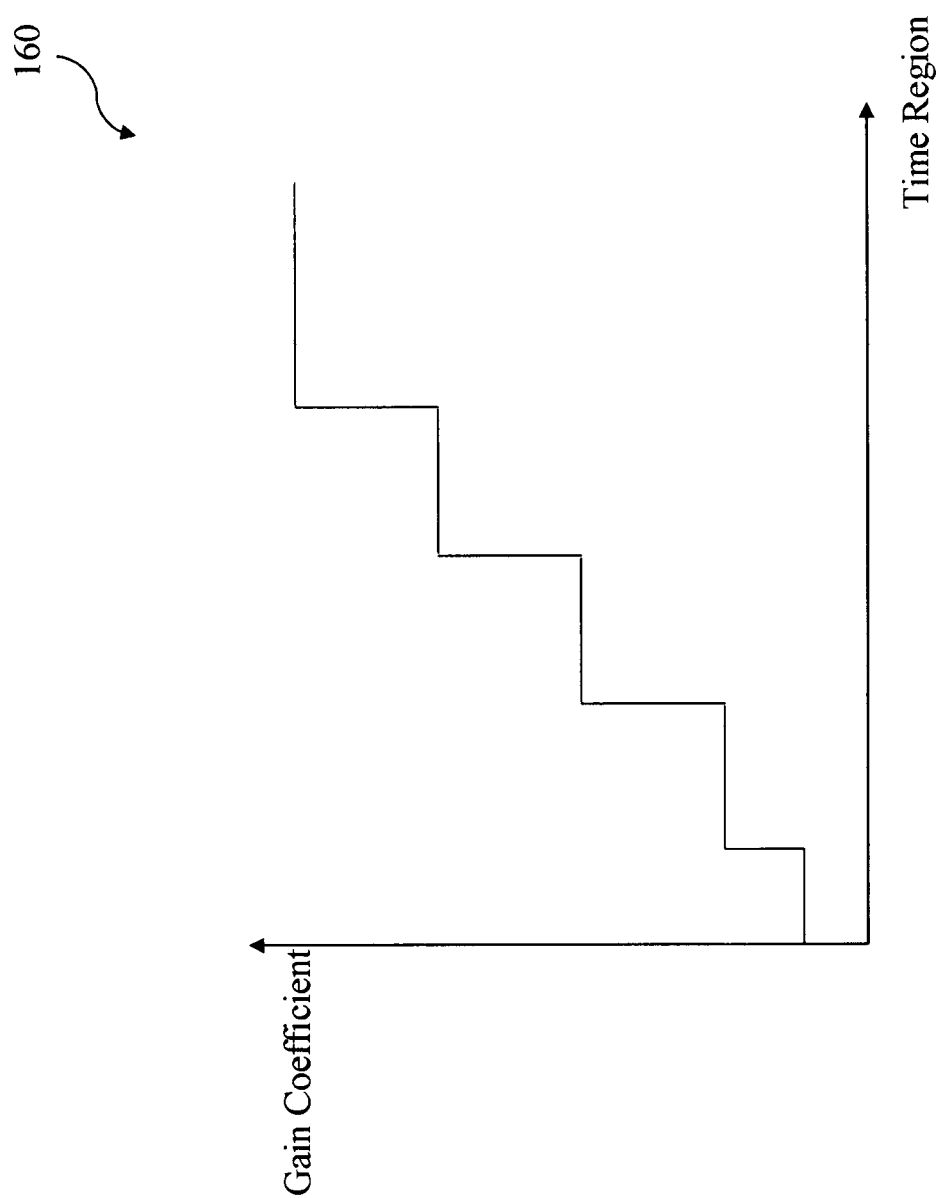
FIG. 6 is a chart of a ladder coefficient constructed according to various aspects of the present disclosure.

At step 126, a varying gain (or gain coefficient) is used to differentiate the polishing signals from various time regions of the pad life. In the present embodiment, a ladder (gain) coefficient 160 is used, as shown in FIG. 6. In FIG. 6, the horizontal axis represents a time region, and the vertical axis represents a gain coefficient. The gain coefficient has a respective value for each individual time region of the pad life. Each time region's gain coefficient is different from the gain coefficient of other time regions in order to identify the time region of the polishing signal during a CMP process. In the present embodiment, each successive time region has a gain coefficient value higher than the previous time region's gain coefficient value. More particularly, the ladder coefficient 160 is applied to adjust, and in the present example, amplify the polishing signal. The ladder coefficient is designed so that differences between the polishing signals of various time regions are large enough such that the subsequent steps of the method 120 can be implemented without misinterpretation.

Figure 7:
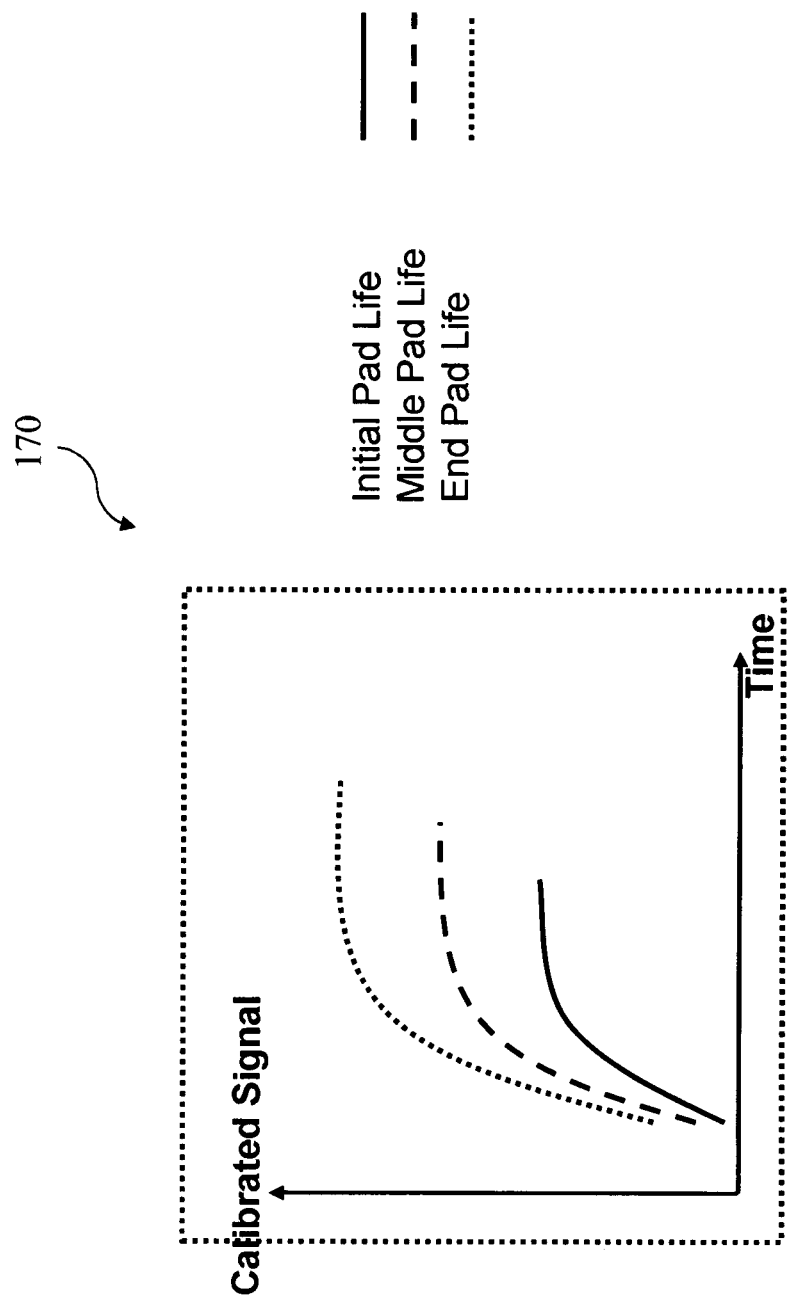
FIGS. 7 and 8 are charts of the polishing signals at various time regions used for determining the CMP endpoint constructed according to various aspects of the present disclosure.

After the ladder coefficient 160 is applied, the polishing signals from different time regions of the pad life are substantially differentiable. FIG. 7 is a chart 170 illustrating polishing signals over time according to one example. FIG. 7 is similar to FIG. 5. In FIG. 7, the pad life is divided into three time regions including initial pad life, middle pad life, and end pad life. However, a ladder coefficient is applied to the polishing signals so that the polishing signals in different time regions are amplified (or calibrated) into different levels, labeled as "calibrated signal" in FIG. 7. Since the calibrated polishing signal is used to determine the endpoint of a CMP process, the calibrated polishing signal is also referred to as the endpoint signal or simply the polishing signal.

The method 120 proceeds to step 128 by defining endpoint windows for the time regions of the pad life, respectively. Instead of using one endpoint window, a plurality of endpoint windows are used. The plurality of endpoint windows are associated with the plurality of time regions, respectively.

Figure 8:
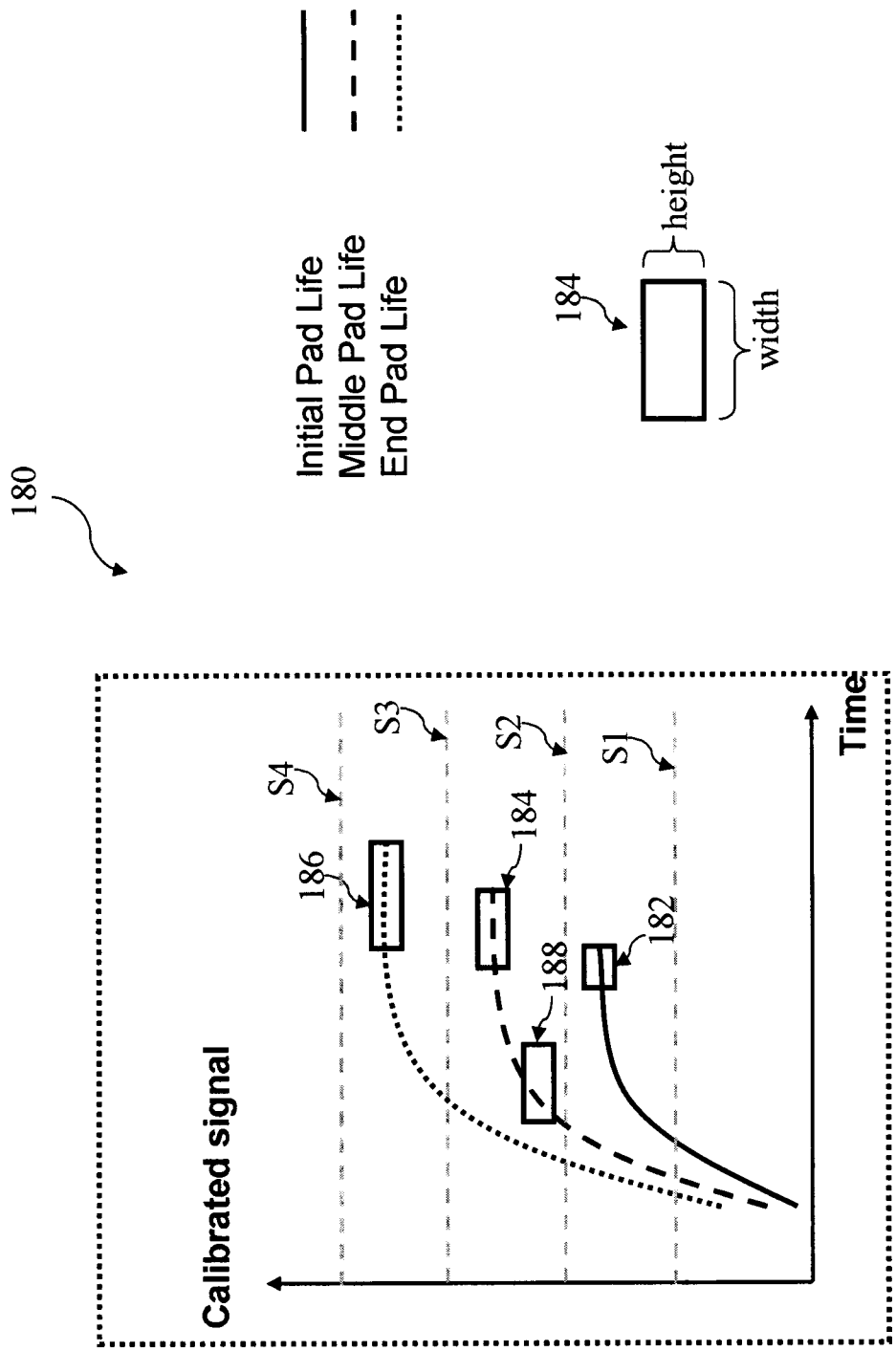

The endpoint window is described with reference to FIG. 8. FIG. 8 includes a chart 180 similar to that of FIG. 7, but further includes endpoint windows. FIG. 8 includes three calibrated signals, corresponding to initial pad life, middle pad life, and end pad life, respectively. In the present embodiment, three endpoint windows 182, 184, and 186 are assigned to the initial pad life, middle pad life, and end pad life, respectively. An endpoint window is used to determine the endpoint of a CMP process. The endpoint window is defined as a rectangle having a height and a width. The height of the endpoint window is related to the polishing signal, has a unit that is the same as that of the polishing signal, and is referred to as $\Delta S$. The width of the endpoint window is related to the polishing time, has a unit that is the same as that of the polishing time, and is referred to as $\Delta t$.

At step 128, each time region of the pad life is assigned a respective endpoint window with particular dimensions. In the present embodiment, the endpoint windows assigned to the polishing pad 104 have a same height, $\Delta S$, but different widths, $\Delta t$. In one example, the width $\Delta t$ for each endpoint window can be determined by an engineer according to processing knowledge and CMP data. As another example for illustration, the various widths may range between about 3 seconds and about 7 seconds.

The steps 122 through 128 provide a procedure to set up the CMP system 100 and enable the CMP system 100 to end a CMP process according to the time region of the polishing pad 104. This procedure is not necessarily implemented to the polishing pad 104 every time before performing a CMP process. The procedure may be applied to the polishing pad 104 when the polishing pad 104 is replaced or other CMP parameters are changed. For example, when a new type CMP slurry is introduced into the polishing pad 104, the procedure including the steps 122 through 128 is applied to the polishing pad 104 to set up the CMP system 100 accordingly.

The method 120 also provides another procedure, including step 130 through step 138, to implement a CMP process and stop the CMP process according to the time region of the pad life. At step 130, a CMP process is applied to the wafer 102 on the polishing pad 104. The polishing pad 104 is within a certain time region of its life time. During the CMP process, the ISRM 110 in-situ monitors the CMP process and collects the polishing signal from the wafer 102 on the polishing pad 104. The polishing signal may be similar to one of the polishing signals in FIG. 8, assuming that the three time regions (initial pad life, middle pad life, and end pad life) are defined for the polishing pad 104. The polishing signal increases over the polishing time and gradually approaches a flat stage where the polishing signal has no significant change over the polishing time.

Still referring to FIG. 8, the method 120 proceeds to step 132 by determining the time region of the polishing pad 104 based on the polishing signal. First, various lower limits and upper limits are defined for different time regions. For example, a lower limit S1 and an upper limit S2 are defined for the polishing signal associated with the initial pad life. Similarly, the middle pad life has a lower limit S2 and an upper limit S3, and the end pad life has a lower limit S3 and an upper limit S4. The respective lower limits and upper limits can be set up according to the ladder coefficient. When the ladder coefficient has a greater increase at each time region, the upper limit of the corresponding time region will increase accordingly. The lower limits and the upper limits can be determined by an engineer or automatically calculated using an algorithm considering the ladder coefficient.

The time region of the polishing pad 104 is determined according to the lower limits and the upper limits. If the polishing signal approaches the flat stage and the flat portion is between S2 and S3, the corresponding time region of the polishing pad 104 is the middle pad life. If the polishing signal approaches a flat stage between S3 and S4, the time region of the polishing pad 104 is determined to be at the end pad life.

The method 120 may proceed to step 134 by associating an endpoint window to the polishing signal according to the time region that is determined at step 132. At step 128, various endpoint windows are defined and assigned to the various time regions, respectively. Accordingly, each time region has one corresponding endpoint window. At step 134, the time region of the polishing pad is known, as determined at step 132. The corresponding endpoint window of the time region is associated with the CMP process.

The method 120 proceeds to step 136 by determining the endpoint of the CMP process using the associated endpoint window. Still referring to FIG. 8, assume that the time region of the polishing pad is determined to be the middle pad life at step 132 and the associated endpoint window is determined to be the endpoint window 184 at step 134. In one embodiment, the endpoint of the CMP process is defined as follows. The associated endpoint window 184 fits to a portion of the polishing signal associated with the middle pad life (dashed line --- in FIG. 8), and the endpoint is defined as the polishing time aligned with the right side of the endpoint window 184. Particularly, the endpoint window 184 is positioned around the polishing signal (dashed line ---) and is moved toward the flat stage until the portion of the polishing signal within the width $\Delta t$ fits in the endpoint window 184. The portion of the polishing signal within the width $\Delta t$ intersects with the left side and the right side of the endpoint window, as illustrated in FIG. 8. As a contrary example, the endpoint window 188 is positioned on the polishing signal associated with the middle pad life, and the endpoint window 188 intersects with top side and bottom side of the endpoint window 188. In this case, the polishing signal does not fit in the endpoint window 188. When a portion of the corresponding polishing signal fits in the endpoint window 184, the endpoint of the CMP process is determined as the time aligned with the right side of the endpoint window 184.

At step 138, the CMP process is ended at the endpoint determined at step 136. During the CMP process, the polishing signal is continuously collected by the ISRM 110. The associated endpoint window is used to check if any portion of the polishing signal fits in. When a portion of the polishing signal fits in the endpoint window, the CMP process will be stopped at the corresponding endpoint.

Additionally, a maximum polishing time $t_m$ may be defined according to the CMP process, characteristics of the material layer to be polished, and characteristics of the polishing pad 104. In one embodiment, the maximum time tm is determined according to the time region of the pad life. The polishing time is additionally checked with the maximum polishing time tm. If the polishing time is equal to the maximum polishing time tm, the CMP process is ended even if none of the polishing signal fits in the endpoint window. In this case, the wafer may be sent for engineer disposition to verify if the polishing result meets the specification or manufacturing requirement of the wafer 102.

Although the method 120 is provided for a CMP process ending at an endpoint determined according to the pad life effect, other variations may also be possible within the scope of the invention. In one embodiment, the steps 122 through 128 are carried out as a first procedure to set up the CMP system 100 and the steps 130 through 138 are carried out as a second procedure to implement a CMP process in the CMP system 100. The first and second procedures can be independently implemented. Once the first procedure is completed, the second procedure can be repeatedly applied to each of the wafers 102 for polishing on the polishing pad 104 of the CMP system 100 until the polishing pad 104 is to be replaced or other event triggers the first procedure.

In another embodiment, the CMP system 100 includes more than one polishing pad. Each polishing pad may have its specific polishing behavior and pad life. The time regions and the endpoint windows may be defined differently from pad to pad. In yet another embodiment, when the polishing pad 104 is replaced, the new polishing pad may have different polishing behavior due to the polishing pad type or other factors. The time regions and the endpoint windows of the new polishing pad 104 may be defined different from those of the previous polishing pad 104.

Figure 9:
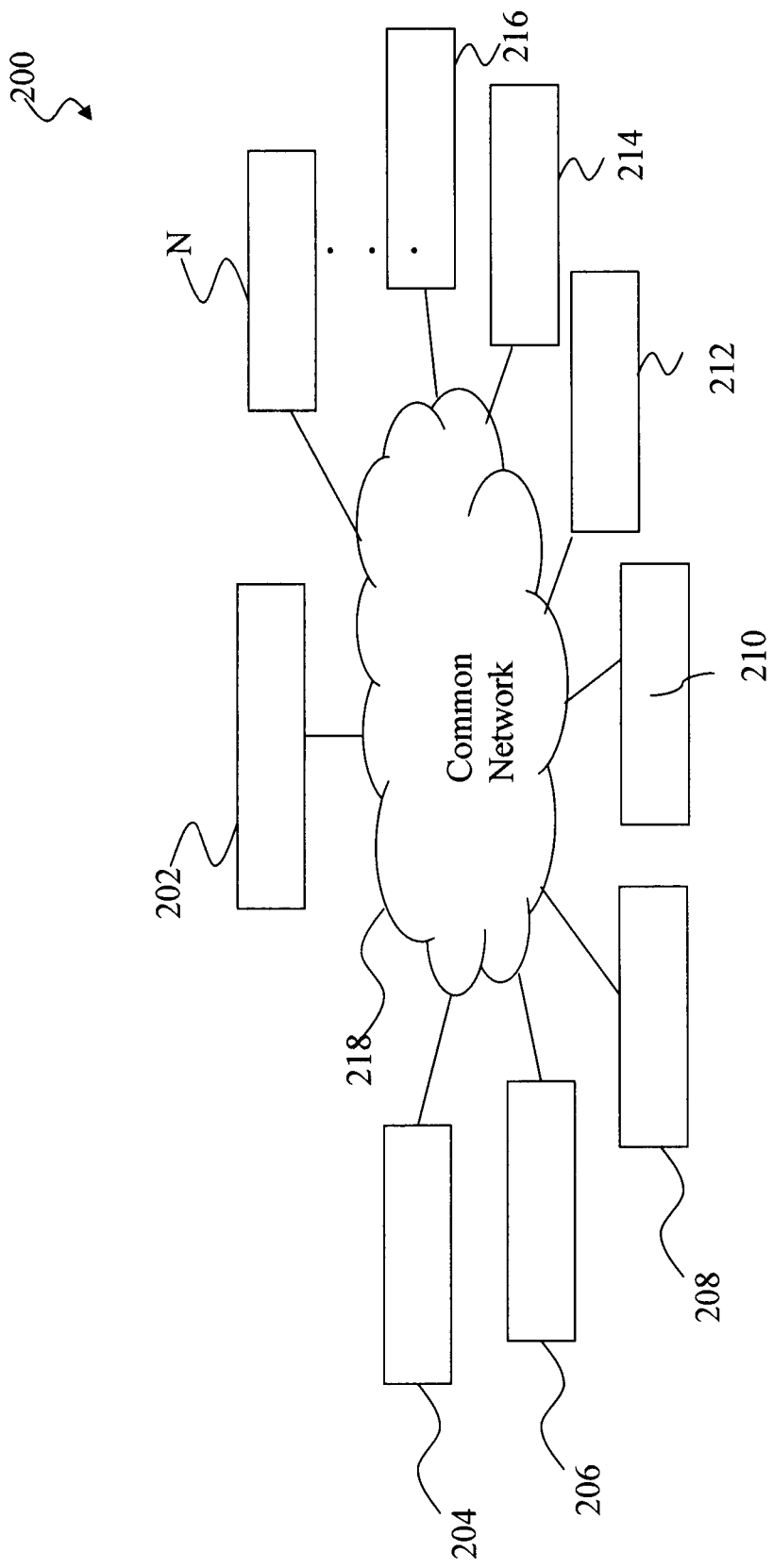
FIG. 9 is a schematic view of an integrated circuit fabrication system in which the CMP system of FIG. 1 is integrated according to one embodiment.

FIG. 9 illustrates an integrated circuit fabrication system 200 within which the CMP system 100 of FIG. 1 may be utilized or distributed therein. The fabrication system 200 includes a plurality of entities 202, 204, 206, 208, 210, 212, 214, 216 . . . , N that are connected by a communications network 218. The network 218 may be a single network or may be a variety of different networks, such as an intranet and the Internet, and may include both wireline and wireless communication channels.

In the present example, the entity 202 represents a service system for manufacturing collaboration, the entity 204 represents a user, such as a product engineer monitoring the interested products, the entity 206 represents an engineer, such as a processing engineer to control the CMP processes, the entity 208 represents a metrology tool for IC testing and measurement for collecting CMP data, the entity 210 represents a CMP tool such as the CMP system 100 of FIG. 1, the entity 212 represents a virtual metrology module associated with the CMP tool 210, the entity 214 represents a processing control module associated with the CMP tool 210 and additionally other processing tools, and the entity 216 represents a database having various CMP data associated with the CMP tool 210. Each entity may interact with other entities and may provide integrated circuit fabrication, processing control, and/or calculating capability to and/or receive such capabilities from the other entities.

In one embodiment, the CMP tool 210 includes a polishing pad designed for wafer polishing; a motor driver coupled with the pad and designed to drive the pad during the wafer polishing; a controller coupled with the motor driver and designed to control the motor driver; and an in-situ rate monitor designed to collect polishing data from a wafer on the pad, determine CMP endpoint based on a life stage of the polishing pad, and provide the CMP endpoint to the controller. In another embodiment, the in-situ rate monitor may further include a signal module designed to extract a polishing signal from the wafer; a mechanism for applying a ladder coefficient to amplify the polishing signal according to the life stage of the polishing pad; a window module for defining and applying multiple endpoint windows with respective window widths; and an endpoint module for determining the CMP endpoint by applying one of the multiple endpoint windows to the polishing signal according to the life stage of the polishing pad. The CMP system may further include another pad for wafer polishing and coupled with the in-situ rate monitor.

The CMP tool 210 is adaptive since the endpoint of a CMP process changes among the time regions of the polishing pad and is determined according to the pad life effect.

The integrated circuit fabrication system 200 enables interaction among the entities for the purpose of integrated circuit (IC) manufacturing, particularly the processing control of the CMP tool 210 and the control of the CMP endpoint according to the pad life effect. In the present example, the control of the CMP endpoint includes defining a plurality of time regions of pad life to a polishing pad in a CMP system, and defining a plurality of endpoint windows to the plurality of time regions, respectively. In various embodiments, the control of the CMP endpoint includes assigning a ladder coefficient to the polishing signals associated with the polishing pad.

One of the capabilities provided by the IC fabrication system 200 may enable collaboration and information access in such areas as production control, engineering, and processing, metrology, and advanced processing control. Another capability provided by the IC fabrication system 200 may integrate systems between facilities, such as between the metrology tool and the CMP tool. Such integration enables facilities to coordinate their activities. For example, integrating the metrology tool and the CMP tool may enable manufacturing information to be incorporated more efficiently into the fabrication process, and may enable wafer data from the online or in site measurement with the metrology tool integrated in the associated processing tool (CMP tool).

Thus, the present disclosure provides a semiconductor manufacturing method. The method includes defining a plurality of time regions of pad life for a polishing pad in a chemical mechanical polishing (CMP) system; assigning a ladder coefficient to the polishing pad according to the plurality of time regions of pad life; defining a plurality of endpoint windows to the plurality of time regions, respectively, according to pad life effect; applying a CMP process to a wafer positioned on the polishing pad; determining a time region of a polishing signal of the wafer based on the ladder coefficient; associating one of the endpoint windows to the polishing signal according to the time region; and ending the CMP process at an endpoint determined by the endpoint window.

In the present embodiment, the method further includes, before the ending of the CMP process, determining the endpoint by fitting the endpoint window to a portion of the polishing signal. In another embodiment, the polishing signal is a signal from the wafer multiplied by the ladder coefficient within the time region. In another embodiment, the determining of the time region includes defining an upper limit and a lower limit of the polishing signal relative to the time region; and determining that the polishing signal is associated with the time region if a flat portion of the polishing signal is within a range between the upper limit and the lower limit. The defining of the plurality of endpoint windows may include defining a plurality of window widths to the plurality of endpoint windows, respectively. The assigning of the ladder coefficient includes defining the ladder coefficient having a plurality of gain levels corresponding to the plurality of time regions of pad life, respectively. In one embodiment, the defining of the plurality of time regions includes defining an initial pad life region, a middle pad life region and an end pad life region. The semiconductor manufacturing method may further include collecting CMP endpoint data, and extracting a polishing characteristic parameter of the polishing pad. The defining the plurality of time regions of pad life may include defining the plurality of time regions of pad life for the polishing pad based on the polishing characteristic parameter. In one example, the polishing characteristic parameter includes a polishing ratio defined as a ratio between a polishing rate of a metal material and a polishing rate of a dielectric material. In another example, the polishing ratio is defined as a ratio between an aluminum polishing rate and a silicon oxide polishing rate.

The present disclosure also provides another embodiment of a semiconductor manufacturing method. The semiconductor manufacturing method includes performing a chemical mechanical polishing (CMP) process to a wafer positioned on a polishing pad in a CMP system; and ending the CMP process at an endpoint determined by a life stage of the polishing pad.

In one embodiment of the present method, the ending the CMP process includes determining the endpoint using an endpoint window having a window width particular to the life stage of the polishing pad. In another embodiment, the method may further include defining a plurality of life stages for the polishing pad; and defining window widths for a plurality of endpoint windows associated with the plurality of life stages, respectively according to pad life effect. In another embodiment, The method further includes receiving an polishing signal of the CMP process; determining the life stage of the polishing pad based on a level of the polishing signal; associating one of the endpoint windows to the polishing signal according to the life stage of the polishing pad; and determining the endpoint by applying the one of the endpoint windows to the polishing signal. In another embodiment, the determining of the life stage of the polishing pad includes assigning a ladder coefficient to the polishing pad; and amplifying the polishing signal according to the ladder coefficient. In yet another embodiment, the ending the CMP process further includes determining a maximum time according to the life stage of the polishing pad; and verifying if the endpoint is within the maximum time.

The present disclosure also provides one embodiment of a chemical mechanical polishing (CMP) system. The CMP system includes a polishing pad designed for wafer polishing; a motor driver coupled with the polishing pad and designed to drive the polishing pad during the wafer polishing; a controller coupled with the motor driver and designed to control the motor driver; and an in-situ rate monitor designed to collect polishing data from a wafer on the polishing pad, determine CMP endpoint based on a life stage of the polishing pad and provide the CMP endpoint to the controller.

In the CMP system, the in-situ rate monitor may further include a signal module designed to extract an polishing signal from the wafer; a mechanism for applying a ladder coefficient to amplify the polishing signal according to the life stage of the polishing pad; a window module for defining and applying multiple endpoint windows with respective window widths; and an endpoint module for determining the CMP endpoint by applying one of the multiple endpoint windows to the polishing signal according to the life stage of the polishing pad. The CMP system may further include another polishing pad for wafer polishing and coupled with the in-situ rate monitor.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A chemical mechanical polishing (CMP) system, comprising:
   a pad designed for wafer polishing;
   a motor driver coupled with the pad and designed to drive the pad during the wafer polishing;
   a controller coupled with the motor driver and designed to control the motor driver; and
   an in-situ rate monitor including a signal module designed to extract a polishing signal during the wafer polishing, wherein the in-situ rate monitor is designed to amplify the polishing signal according to a life stage of the pad, determine CMP endpoint based on the life stage of the pad, and provide the CMP endpoint to the controller.

2. The CMP system of claim 1, wherein the in-situ rate monitor includes:
   a window module for defining and applying multiple endpoint windows with respective window widths; and
   an endpoint module for determining the CMP endpoint by applying one of the multiple endpoint windows to the polishing signal according to the life stage of the pad.

3. The CMP system of claim 1, further comprising another pad for wafer polishing and coupled with the in-situ rate monitor.

4. A chemical mechanical polishing (CMP) system, comprising:
   a polishing pad configured to polish a wafer;
   a motor driver coupled with the polishing pad and configured to drive the polishing pad during wafer polishing;
   an in-situ rate monitor configured to define a time region of pad life for the polishing pad and configured to assign a ladder coefficient to the polishing pad according to the time region of pad life; and
   a controller coupled with the motor driver and in-situ rate monitor and configured to control the motor driver to apply a CMP process to the wafer positioned on the polishing pad and control the motor driver to end the CMP process at an endpoint according to the time region of pad life for the polishing pad.

5. The CMP system of claim 4, wherein the in-situ rate monitor is further configured to determine the endpoint using an endpoint window having a window width particular to the time region of the polishing pad.

6. The CMP system of claim 4, wherein the in-situ rate monitor is further configured to determine whether the polishing pad is in the time region based on a level of a polishing signal being applied during the CMP process to the wafer.

7. The CMP system of claim 6, wherein the in-situ rate monitor is further configured to associate an endpoint window to the polishing signal according to the time region, the endpoint window having a width particular to the time region of the polishing pad.

8. A chemical mechanical polishing (CMP) system, comprising:
a polishing pad configured to polish a wafer;
a motor driver coupled with the polishing pad and configured to drive the polishing pad during wafer polishing;
an in-situ rate monitor configured to:
define a plurality of time regions of pad life for the polishing pad;
assign a ladder coefficient to the polishing pad according to the plurality of time regions of pad life;
define a plurality of endpoint windows to the plurality of time regions, respectively, according to pad life effect;
determine a time region of a polishing signal of the wafer based on the ladder coefficient; and
associate one of the endpoint windows to the polishing signal according to the time region; and
a controller coupled with the motor driver and in-situ rate monitor and configured to control the motor driver to apply a CMP process to the wafer positioned on the polishing pad and control the motor driver to end the CMP process at an endpoint determined by the endpoint window associated with the polishing signal.

9. The CMP system of claim 8, wherein the in-situ rate monitor is further configured to, before an end of the CMP process, determine the endpoint by fitting the endpoint window to a portion of the polishing signal.

10. The CMP system of claim 8, wherein the polishing signal is a signal from the wafer multiplied by the ladder coefficient within the time region.

11. The CMP system of claim 8, wherein the in-situ rate monitor is further configured to
define an upper limit and a lower limit of the polishing signal relative to the time region and determine that the polishing signal is associated with the time region if a flat portion of the polishing signal is within a range between the upper limit and the lower limit.

12. The CMP system of claim 8, wherein the in-situ rate monitor is further configured to define a plurality of window widths corresponding to the plurality of endpoint windows, respectively.

13. The CMP system of claim 8, wherein the in-situ rate monitor is further configured to define the ladder coefficient with a plurality of gain levels corresponding to the plurality of time regions of pad life, respectively.

14. The CMP system of claim 8, wherein the in-situ rate monitor is further configured to define an initial pad life region, a middle pad life region, and an end pad life region.

15. The CMP system of claim 8, wherein the in-situ rate monitor is further configured to collecting CMP data, and extracting a polishing characteristic parameter of the polishing pad.

16. The CMP system of claim 15, wherein the in-situ rate monitor is further configured to define the plurality of time regions of pad life for the polishing pad based on the polishing characteristic parameter.

17. The CMP system of claim 15, wherein the polishing characteristic parameter includes a polishing ratio defined as a ratio between a polishing rate of a metal material and a polishing rate of a dielectric material.

18. The CMP system of claim 17, wherein the polishing ratio is defined as a ratio between an aluminum polishing rate and a silicon oxide polishing rate.

19. The CMP system of claim 8, further including a CMP data module configured to collect data associated with the polishing pad.

20. The CMP system of claim 19, wherein the data associated with the polishing pad includes at least one of polishing rate, CMP failure information, system maintenance record data, polishing pad replacement record data, and out of specification (OOS) records.

* * * * *